United States Patent [19]

Truong et al.

[11] Patent Number: 5,652,582
[45] Date of Patent: Jul. 29, 1997

[54] METHOD OF HIGH SPEED HUFFMAN CODING AND DECODING OF LAB COLOR IMAGES

[75] Inventors: Thanh D. Truong, Walnut; Vinod Kadakia, Rancho Palos Verdes, both of Calif.

[73] Assignee: Xerox Corporation, Stamford, Conn.

[21] Appl. No.: 581,687

[22] Filed: Dec. 29, 1995

[51] Int. Cl.$^6$ ................................................ H03M 7/40
[52] U.S. Cl. ............................................ 341/65; 341/106
[58] Field of Search .................... 341/65, 106; 348/417, 348/418; 375/240

[56] References Cited

U.S. PATENT DOCUMENTS 5,124,791   6/1992   Isralsen et al. .................. 358/136

*Primary Examiner*—Brian K. Young
*Attorney, Agent, or Firm*—Robert Cunha

[57] ABSTRACT

A circuit for decoding Huffman-encoded words describing color pixels in the Lab color space at the rate of one per clock cycle. The encoded words are formed into two strings of bits, one for coded L words and one for a and b words, each set of a and b words encoded into one Huffman code word, and two decoders in parallel are used, each first shifting in a number of coded bits during a first clock period, and converting the Huffman code to data on a second clock period. The two parallel decoders are timed so that the shift cycle of one decoder occurs at the same time as the conversion cycle of the other. Finally, the two streams of decoded data words are combined into one stream. The result is one output data word, either L or ab, per clock cycle.

2 Claims, 3 Drawing Sheets

METHOD OF HIGH SPEED HUFFMAN CODING AND DECODING OF LAB COLOR IMAGES

BACKGROUND OF THE INVENTION

An iterative method of Huffman coding and decoding of color image data in the Lab color space where the coder loads a plurality of L coded words into a first buffer, loads a and b code words into second and third buffers, and then proceeds to decode L, a and b code words using two decoders in parallel to double the speed of the decoder.

Huffman coders assign the shortest codes to the most frequently used numbers. For example, the code for a common digital number, such as "512", would most likely be a smaller number than for a relatively rare number, like "511". This results in more compact coding, but time is required to code and uncode the data and system throughput may become limited.

The problem is more difficult in the decoder than in the encoder since the decoder can not pipeline the process. That is, in the coder the consecutive code words can be created in a pipeline since the input data words are of a standard length, and therefore the coder knows prior to coding exactly where each input data word starts and ends. However, since the coded words are of variable length, the decoder does not know where the next code word starts until the current one is decoded. More specifically, decoding a Huffman code word is a two clock process. On the first clock a relatively large word of input data in a register is inspected to determine the number of leading bits that constitute the current code word and that number of bits are output to a look up table decoder. On the second clock, that number of new bits are shifted in to refill the register for the next clock. A system which allows the decoder to produce an output on every clock pulse would be advantageous.

A second difficulty arises when the input data is a color image and is described using the Lab color space. The characteristics of the L terms are different from the a and b terms and require that the L term is sent to a different decoder from that used for the a and b terms. Ultimately, the requirement is for a decoder that can decode L, a and b terms on a word per clock basis. Various types of Huffman coding and decoding processes have been published, but do not disclose this invention.

U.S. Pat. No. 5,386,213 (Haupt et al.) discloses a coder and decoder apparatus for a data transmission system. The variable length coded data is arranged in blocks having a predetermined average length. Blocks which are not full are filled with data from other blocks.

U.S. Pat. No. 5,239,308 (Kessen) discloses a method of processing coded digital signals which are segmented into variable words. The variable length words are allocated to fixed length blocks. The fixed length blocks having a word length shorter than the predetermined word length are filled up with portions of variable length words having a word length longer than the predetermined word length.

U.S. Pat. No. 5,140,322 (Sakagami) discloses a method of transmitting variable word length coded data. The variable length code words are connected until a predetermined number of bits have been connected. The connected data can then be transmitted.

U.S. Pat. Nos. 5,379,116 (Wada et al.) and 4,963,867 (Bertrand) disclose methods of packing variable length coded data into fixed length packets.

SUMMARY OF THE INVENTION

This invention splits up the coded data into three streams of coded words which may be referred to as L, a and b strings, and loads then into three buffers. In all cases the buffers are ping pong buffers, so the process is for the system to start loading coded words into one buffer until there is an overflow, and then continue loading into the second buffer. While the second buffer is being loaded, the first is in condition to output the data as necessary.

At the decoder, the three strings can be decoded using two decoders, one optimized for L data and the other optimized for a and b data, working in parallel, as follows. First, on one clock pulse, the L decoder accesses a number of L code word data bits, decides how many of them constitute the first code word, and outputs that many bits. On the second clock pulse, the L decoder shifts into its register that number of new data bits that are required to replace the first code word, and the a,b decoder, on the same second clock pulse, decodes the first a code word contained in the a decode register. On the third clock pulse, the a register shifts in new data bits and the a,b decoder decodes one word in the b decoder register. Thus, there is an L, a or b output on every clock pulse.

DETAILED DESCRIPTION OF THE INVENTION

Figure 1:
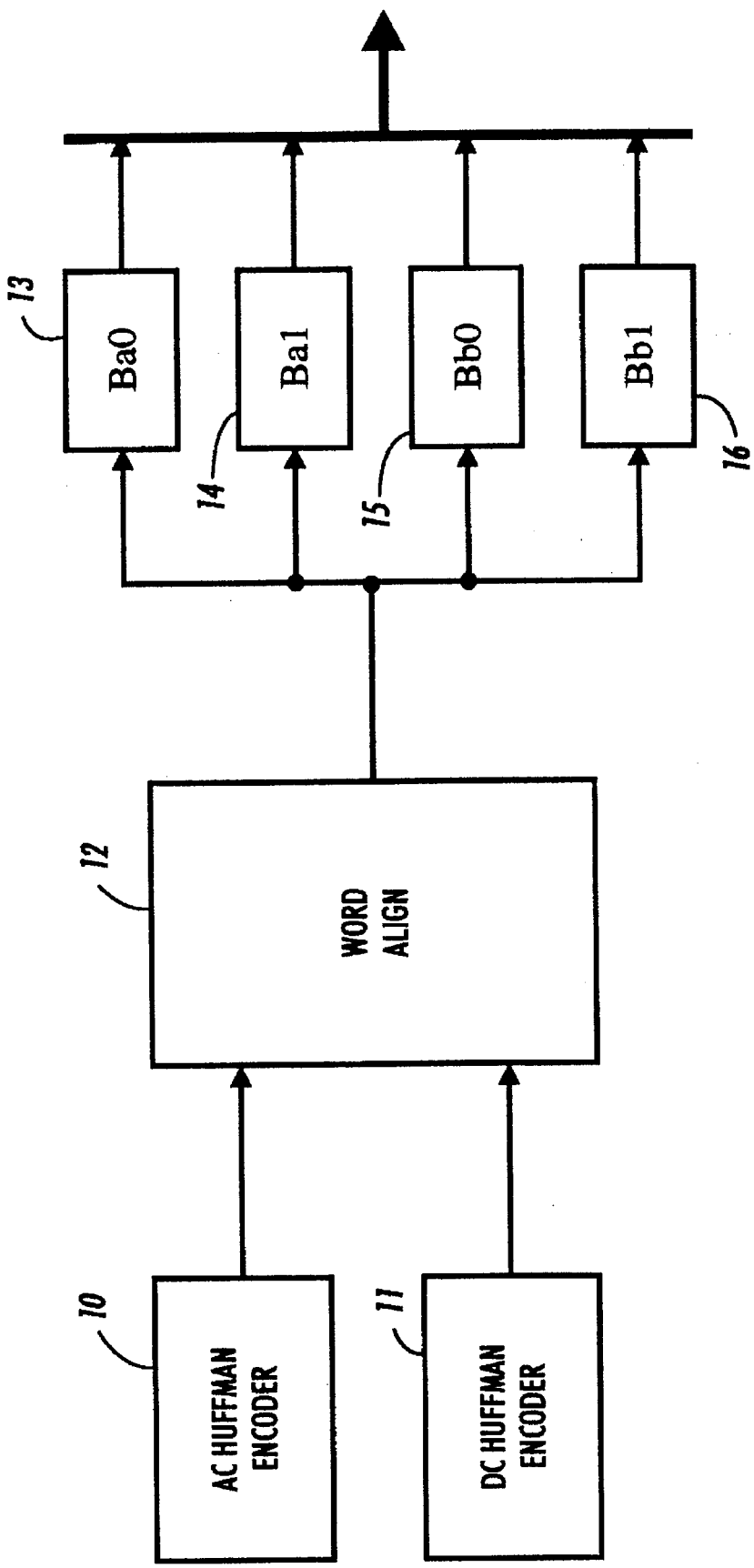
FIG. 1 is a block diagram of the encoder.

A major bottleneck in designing higher speed electronic systems such as color printers is increasing the performance of the compression decoder. Increasing this performance can result in an unacceptably complex design, and requires a high speed clock. The reason for this is that the decode process, which requires a table lookup which normally requires one clock period, and a shift operation which normally requires another clock period, can not be pipelined.

The traditional solution is to use parallel decompressors, each operating on a separate band of the compressed image. This, however, requires that the software partition the raw image into bands, and compress each band separately, each with its own boundary marker code. Also, there must be a complex system of ping pong buffers to allow two decompressors that are operating at half speed to continuously supply output data in one continuous stream at full speed. This invention presents an alternative solution of allowing parallel decoders but without having to divide the image into tagged or coded bands. The result is one output per clock cycle, which makes the remainder of the system less complex, as well as transparent to the user and printer.

The type of data word to be coded by this Huffman code system is assumed in this description to have a number of leading zeros and a data portion. Thus, to use a numerical example, an input word may be 0000 0101. This word can be thought of as a number of leading zeros, known as the run, (5 bits), a data pattern having a number of bits, the size, (3 bits), and the bit pattern (101). Using this system, this data word can be described as 5,3,101. The first two parts of this number, the run and size can now be applied to a typical Huffman coder, which assigns the smallest codes to the most often used inputs, to generate the first part of the actual code word. Again, to use this same numerical example, the code word would be a number of bits, such as 100, and would be the coded equivalent of 5,3. Next, the actual bit pattern (101) is added to the first part of the code word, to make the completed code wrod, 100101.

In the decoder, the opposite process is performed. The pattern 100 is used to address a look up table, the output of which will be 5,3, and the pattern is used to generate the final decoded number having 5 leading zeros and a three bit pattern 101, making the final word 0000 0101, which is the same as the original input. In this example the input word is 8 bits and the code word is 6 bits so there is some compression. Input words having long runs of zeros will have a greater amount of compression, while input words that are short and uncommon will compress poorly, or may even be expanded. Finally, the number of bits in a code word can vary widely.

The compressed data stream, ignoring markers or stuffed bytes, consists of codes HID1 ... HjDj ..., where HjDj represents the Huffman code bits Hj and appended data, if any, Dj. The encoded image is in principle a linear list of these segments (HjDj ...), which must be decoded in series, since the next Huffman (entropy) segment cannot be located until the preceeding one is decoded. This precludes the use of parallel decoders unless the raw image is encoded into separate bands, each with an RST marker.

In this invention, when encoding the image, the encoder arranges the compressed data into three separate linear lists of entropy encoded lists, list 1 being all of the L terms, list 2 being all of the a terms, and list three being all of the b terms. In this embodiment the code words may be from 4 to 26 bits in length, joined together into continuous strings of bits and packed into 32 bit words. Each list can be decoded separately by using two parallel decoders, one for the L terms, and one for the a and b terms which have a different data form and content and require a differently optimized decoder. The decoded data is then merged and can be fed into a common high speed printing engine.

This technique is transparent to the user since no additional software, no partitioning of the image into bands and no special insertion of band separation codes are required.

FIG. 1 is a block diagram of the encoder. Image data to be encoded is delivered through a predictor to maximize the length of zero strings to the two decoders 10, 11. The first pixel in each data block is encoded differently from the remainder and is encoded in encoder 11. The remainder of the data is encoded in encoder 10. The code words thus produced, which comprise the Huffman code bits, denoting run and size, and the data bits, denoting the actual bit pattern, are coupled to the word align block 12 where the first code word is placed first in the string, and the string is then separated into three lists of L, a and b code words, each of which is integrated into a continuous string of binary bits and output onto a 32 bit bus to a number of eight word by 32 bit ping pong buffers 13 through 16. Any buffer can be used to collect a block of data, either L, a or b, and full blocks are sent to storage or transmission.

Figure 2:
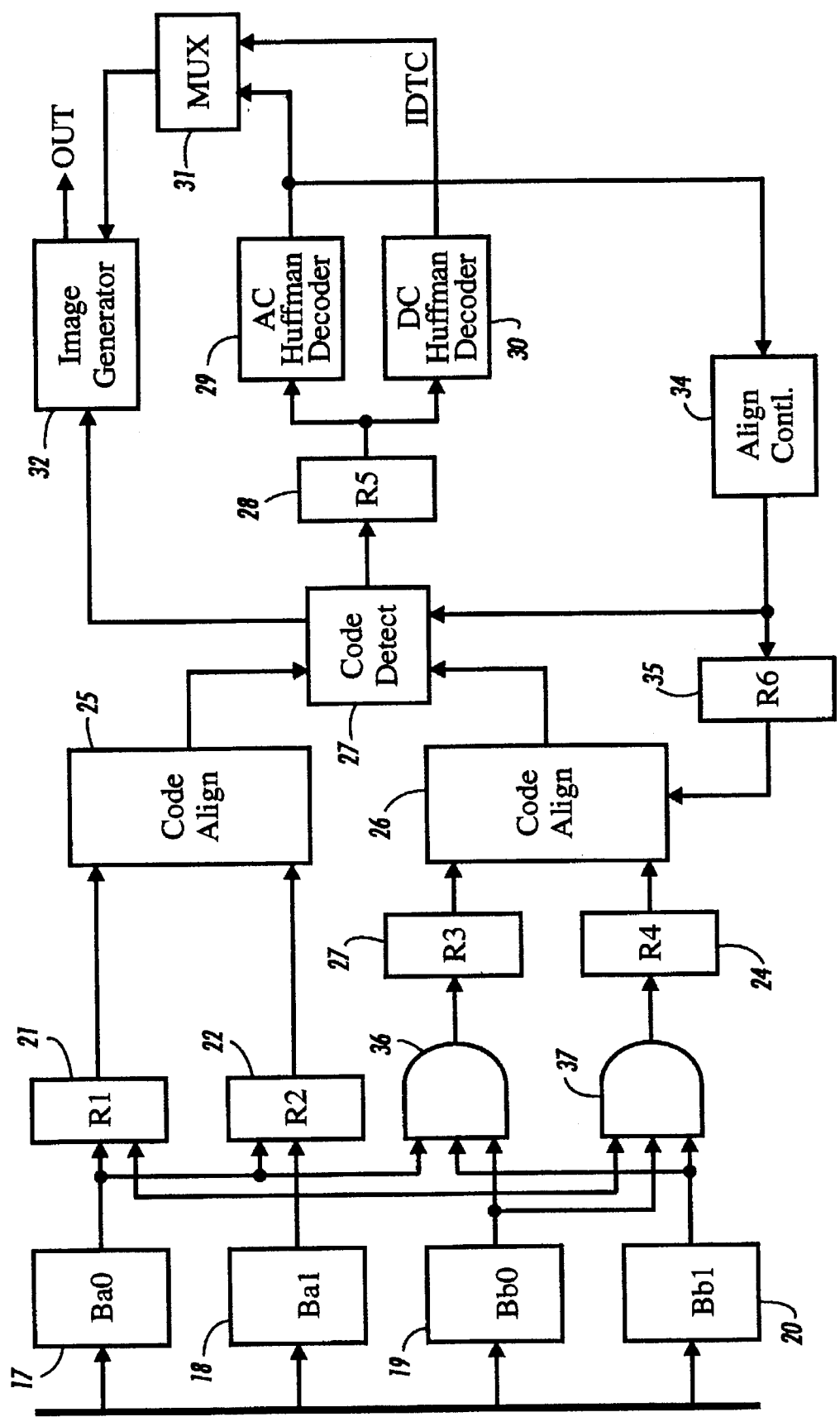
FIG. 2 is a block diagram of the decoder.

When received by the printer, the coded data from memory can now be decoded using the decoder circuit of FIG. 2. Here again, to transfer data between memory and the remainder of the decoder, there are four buffers, each of eight words by 32 bits, The L buffers 17, 18 feed one word at a time to ping pong registers 21, 22, each of which can store one 32 bit word, which feed a constant supply of bits to the L code align block 25 which aligns the words into the proper order and sends the resultant string of bits to the L side of the code detect block 27. Similarly, registers 23, 24 send a and b code through the ab code align block 26 to the other side of the code detect block 27.

On the L side of the code detect block 27 the current string of bits equal in length to the length of the largest code word is sent to the comparator logic where an 8 bit value will result. This is temporarily stored in buffer register 28 and is then used as an address in the AC Huffman decoder 29 look up table to generate an output of up to 8 bits which constitute run and size descriptions.

On the ab side of the code detect block 27, there are two registers holding codes for a and b components respectively. On a first cycle, the code in a bits is extracted in Code detect 27 and a corresponding address will result. On the next clock, the code in b bits is exteracted in Code detect 27, and a corresponding address will also result.

The decoder 29 is a look up table and converts the Huffman code to a run and size number pair. In case the word being processed is the first word of a block, the DC decoder 30 will be used. A multiplexer 31 selects the output of decoder 30 for the first output and the remainder from decoder 29.

The output of the multiplexer 31 now contains the run and size information, but is still lacking the data pattern. This is supplied by the code detector 27 to the image generator 32. The process is for the output of the decoders 29, 30 to be sent through the align control block 34 to the decoder 27. The decoder adds the number of bits it has determined to be in the Huffman part to the number of bits specified by the size portion of the decoder 29 output, and uses that total as determining how many bits to shift to get the next code word completely shifted in. Further, the actual data in the data portion of the code is sent from the decoder 27 to the image generator 32 where it is added onto the Huffman portion. The complete code word containing run, size and data parts is now used to generate the original image data, in its correct order. Finally, the run/size information output by the align block 34 is sent through timing register 35 to the code align blocks 25, 26 so that new data, 4 to 16 bits, will be supplied to the detector 27 as the previous data is consumed.

Figure 3:
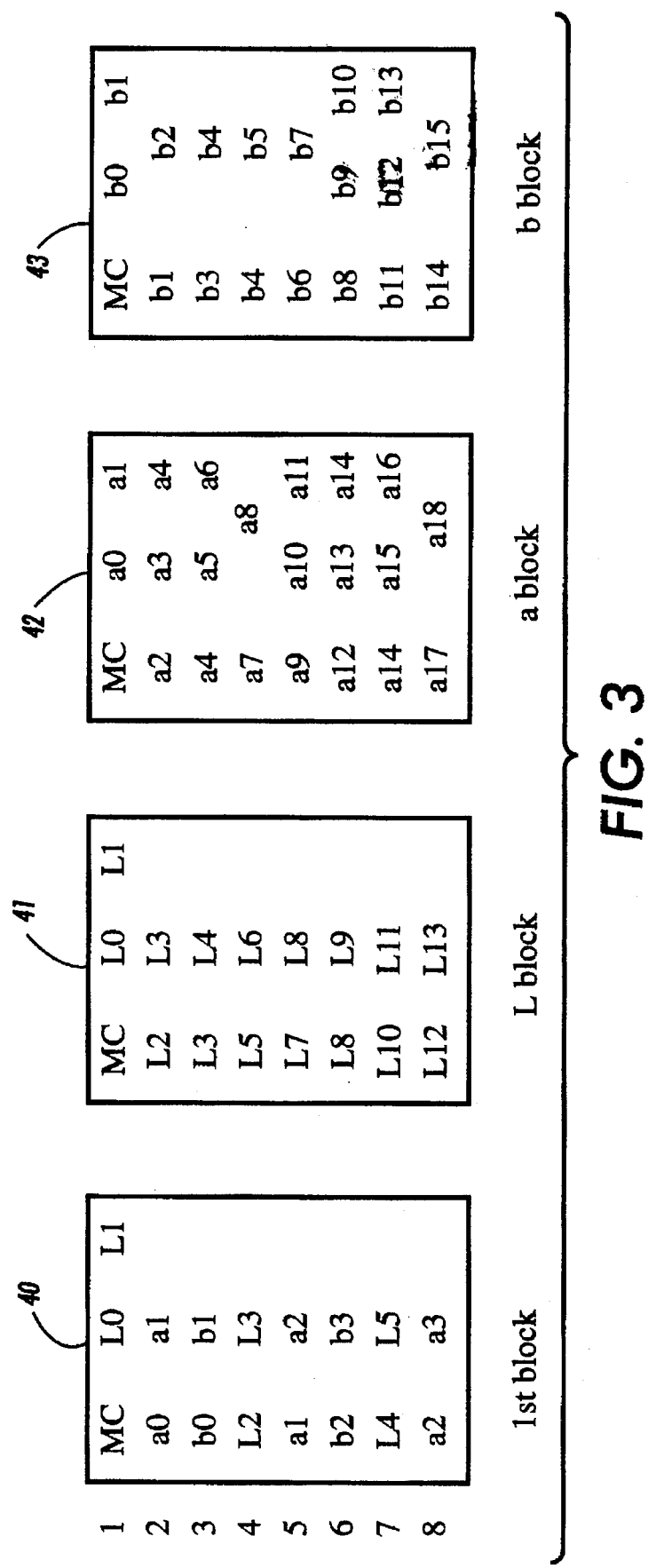
FIG. 3 shows the arrangement of the coded data in storage.

FIG. 3 is a diagram showing the data structure of the encoded data in four blocks of data 40, 41 and 42. Block 41 contains code words numbered L0 through L13. Similarly, block 42 contains 19 and block 43 contains 16 b words. In all cases, there are 4 or less tag bits, MC, at the beginning of a block. A problem with this arrangement occurs when the process starts decoding the first block of a new image. It is required that the pipelines associated with both sides of the decoder 27 be filled immediately to prevent any delays or timing faults. Therefore, the first block 40 of data loaded into buffer 13 contains alternating L, a and b data which can be loaded into the decoder more rapidly than can L, a and b data contained in three different blocks. After the first block 40 of data is consumed, the system reverts back to its normal process of obtaining L, a and b data from different memory blocks.

This diagram shows that the a1 data word is loaded into both lines 2 and 5 of block 40. This is an indication that if a variable length code word is too long to fit on one line, it is simply continued on the next line. The other data blocks have similar places where the same data word is loaded into two different lines.

Since the first block may have L, a and b words, and since this first block of data may be stored in either buffer 17 or 18, multiplexers 36 and 37, FIG. 2, are supplied before registers 23, 24 so that a and b code can be received by a and b registers 23, 24 from buffers 17, 18.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

What is claimed is:

1. A circuit for decoding Huffman encoded Lab color space data words comprising run, size and data pattern information, comprising:

a clock generator, a first register for receiving L coded words and forming them into a continuous string of bits, a second register for receiving a coded words and forming them into a continuous string of bits, a third register for receiving b coded words and forming them into a continuous string of bits, a first decoder responsive to said clock generator for receiving a number of L bits from said first register, and for iteratively decoding said bits to form a series of L intermediate words and data patterns, said first decoder using one clock cycle to detect the size of each L code word, and another cycle to shift in to itself a number of additional bits from said first register to enable the decoding of a next L code word, a second decoder responsive to said clock generator for receiving a number of a bits from said second register, and for iteratively decoding said bits to form a series of a intermediate words and data patterns, said second decoder using one clock cycle to detect the size of each a code word, and another cycle to shift in to itself a number of additional bits from said second register to enable the decoding of a next a code word, said second decoder also for receiving a number of b bits from said third register, and for iteratively decoding said b bits to form a series of b intermediate words and data patterns, said second decoder using one clock cycle to detect the size of each b code word, and another cycle to shift in to itself a number of additional bits from said third register to enable the decoding of a next b code word, said outputting of said L , a and b intermediate words occurring on consecutive clock pulses, means for converting all of said L, a and b intermediate words into L, a and b run and size words, and an image generator for converting all of said L, a and b intermediate words and data patterns into a series of decoded L, a and b data words.

2. The circuit of claim 1 wherein said means for converting is a look up table, and said intermediate words are addresses.

* * * * *